United States Patent
Horikawa et al.

(10) Patent No.: US 9,843,778 B2
(45) Date of Patent: Dec. 12, 2017

(54) IMAGE DISPLAY DEVICE

(71) Applicant: OLYMPUS CORPORATION, Tokyo (JP)

(72) Inventors: Yoshiaki Horikawa, Tokyo (JP); Eiji Yamamoto, Tokyo (JP); Kanto Miyazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 157 days.

(21) Appl. No.: 15/014,431

(22) Filed: Feb. 3, 2016

(65) Prior Publication Data

US 2016/0156885 A1 Jun. 2, 2016

Related U.S. Application Data

(63) Continuation of application No. PCT/JP2014/003681, filed on Jul. 10, 2014.

(30) Foreign Application Priority Data

Aug. 5, 2013 (JP) ................ 2013-162682

(51) Int. Cl.
*H01L 27/146* (2006.01)
*H04N 9/31* (2006.01)
(Continued)

(52) U.S. Cl.
CPC .......... *H04N 9/3129* (2013.01); *G02F 1/292* (2013.01); *H01S 5/0071* (2013.01); *H04N 9/3102* (2013.01); *G02F 2001/291* (2013.01); *G02F 2203/34* (2013.01); *H01L 27/14623* (2013.01); *H01S 5/0085* (2013.01); *H01S 5/18386* (2013.01); *H01S 5/423* (2013.01)

(58) Field of Classification Search
CPC .......................... H01S 5/18386; H01S 5/4075
USPC ......................................................... 257/443
See application file for complete search history.

(56) References Cited

U.S. PATENT DOCUMENTS 5,777,312 A 7/1998 Hanson
7,397,980 B2 7/2008 Frisken
(Continued)

FOREIGN PATENT DOCUMENTS

JP 06-138499 5/1994
JP 06-504633 5/1994
(Continued)

OTHER PUBLICATIONS

Hughes, et al., "Phased Array Optical Scanning," Applied Optics 18(13): 2098, Jul. 1, 1979.
(Continued)

*Primary Examiner* — Chandra Chaudhari
(74) *Attorney, Agent, or Firm* — Andrews Kurth Kenyon LLP

(57) ABSTRACT

Provided is an image display device including: a light source part (200) for emitting coherent light; and a plurality of phase shift elements (301) arranged in two-dimensional directions, the device further including a phase shift part (300) for scanning the wavefront of the coherent light from the light source part (200) in two-dimensional directions, in which light is scanned in the two-dimensional directions by a phased array to thereby allow an observer to observe an image.

6 Claims, 16 Drawing Sheets

(51) Int. Cl.
      *G02F 1/29*      (2006.01)
      *H01S 5/00*      (2006.01)
      *H01S 5/42*      (2006.01)
      *H01S 5/183*     (2006.01)

(56) References Cited

U.S. PATENT DOCUMENTS

| | | | | |
|---|---|---|---|---|
| 7,796,668 B2* | 9/2010 | Hori | ............... | H01S 5/18316 |
| | | | | 372/46.01 |
| 8,515,217 B2* | 8/2013 | Bernasconi | ............ | H01S 5/026 |
| | | | | 385/14 |

FOREIGN PATENT DOCUMENTS

| | | |
|---|---|---|
| JP | 08-163602 | 6/1996 |
| JP | 11-052404 | 2/1999 |
| JP | 2004-511017 | 4/2004 |
| JP | 2007-011104 | 1/2007 |
| JP | 2012-173341 | 9/2012 |

OTHER PUBLICATIONS

International Search Report, dated Oct. 7, 2014, issued in corresponding International Application No. PCT/JP2014/003681.

* cited by examiner

IMAGE DISPLAY DEVICE

CROSS REFERENCE TO RELATED APPLICATIONS

The present application is a Continuing Application based on International Application PCT/JP2014/003681 filed on Jul. 10, 2014, which, in turn, claims the priority from Japanese Patent Application No. 2013-162682 filed on Aug. 5, 2013, the entire disclosure of these earlier applications being herein incorporated by reference.

TECHNICAL FIELD

This disclosure relates to an image display device capable of allowing an observer to observe an image.

BACKGROUND

As a technology of deflecting light by a phased array, it has been known to emit laser light which has been shifted in phase from a single mode fiber array (see, for example, Non-patent Literature (NPL) 1). It has also been known to properly shift the phase of laser light emitted from vertical cavity surface emitting lasers (VCSELs) in a VCSEL array to thereby deflect a laser beam emitted from the VCSEL array (see, for example, Patent Literature (PTL) 1). Further, it has been known to use liquid crystal on silicon (LCOS) to deflect light (see, for example, PTL 2).

CITATION LIST

Patent Literature

PTL 1: U.S. Pat. No. 5,777,312A
PTL 2: U.S. Pat. No. 7,397,980B

Non-patent Literature

NPL 1: Hughes and Ghatak, "Phased Array Optical Scanning", Jul. 1, 1979, p. 2098, Applied Optics, vol. 18, No. 13, Feb. 22, 1995.

SUMMARY

Technical Problem

According to the technology disclosed in NPL 1, the single mode fibers are varied in length so as to emit phase-shifted laser light, in which the length of each of the single mode optical fibers is temporally fixed, meaning that it can deflect light only by a certain angle. The technology disclosed in PTL 1 relates to a barcode reader, where nothing is disclosed about a specific method of shifting the phase of light or about the scanning of light in two-dimensional directions. The technology disclosed in PTL 2 relates to an optical switch (Reconfigurable Optical Add/Drop Multiplexer (ROADM)), where nothing is disclosed about the scanning of light in two-dimensional directions.

Solution to Problem

The disclosed image display device has: a light source part for emitting coherent light; and a plurality of phase shift elements arranged in two-dimensional directions, the device including a phase shift part for scanning, in two-dimensional directions, the wave front of coherent light from the light source part.

BRIEF DESCRIPTION OF THE DRAWINGS

In the accompanying drawings.

DETAILED DESCRIPTION

Figure 1:
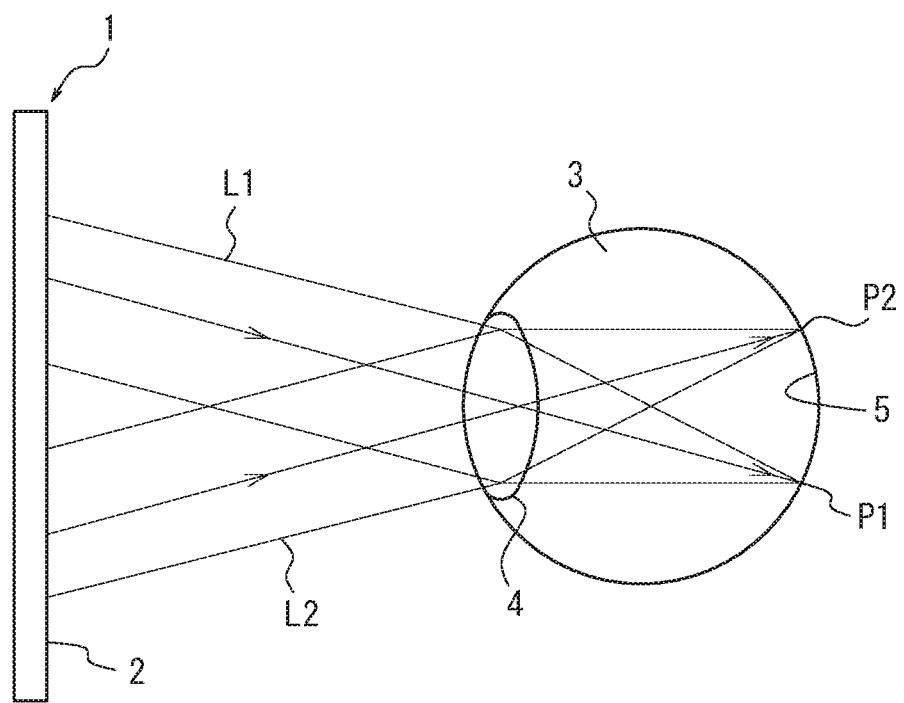
FIG. 1 is for illustrating the principle of the disclosed image display device.

Explained first with reference to FIG. 1 is the principle of an image display apparatus disclosed herein, which is followed by the description of Embodiments.

As illustrated in FIG. 1, when an observer has observed an observation plane 2, a parallel light flux L1 from the observation plane 2 is incident through a pupil of an eyeball 3, and the light flux L1 forms an image at a position P1 on a retina 5 by means of a crystalline lens 4. A parallel light flux L2 to be incident from the observation plane 2 at an angle different from that of the parallel light flux L1 forms an image at a position P2 different from the position P1 on the retina 5. In other words, when light fluxes from the observation plane 2 are incident at different angles on the eyeball 3, the respective light fluxes form images at different positions on the retina 5.

An example of the disclosed image display device emits light provided by sequential pixels of an image to be displayed, as a parallel light flux from the observation plane, that is, as light from infinity, by two-dimensionally deflecting the light by a phased array in accordance with the pixel position. This configuration allows an observer to observe the image.

In the following, Embodiments of the disclosed device are described with reference to the drawings.

Embodiment 1

Figure 2:
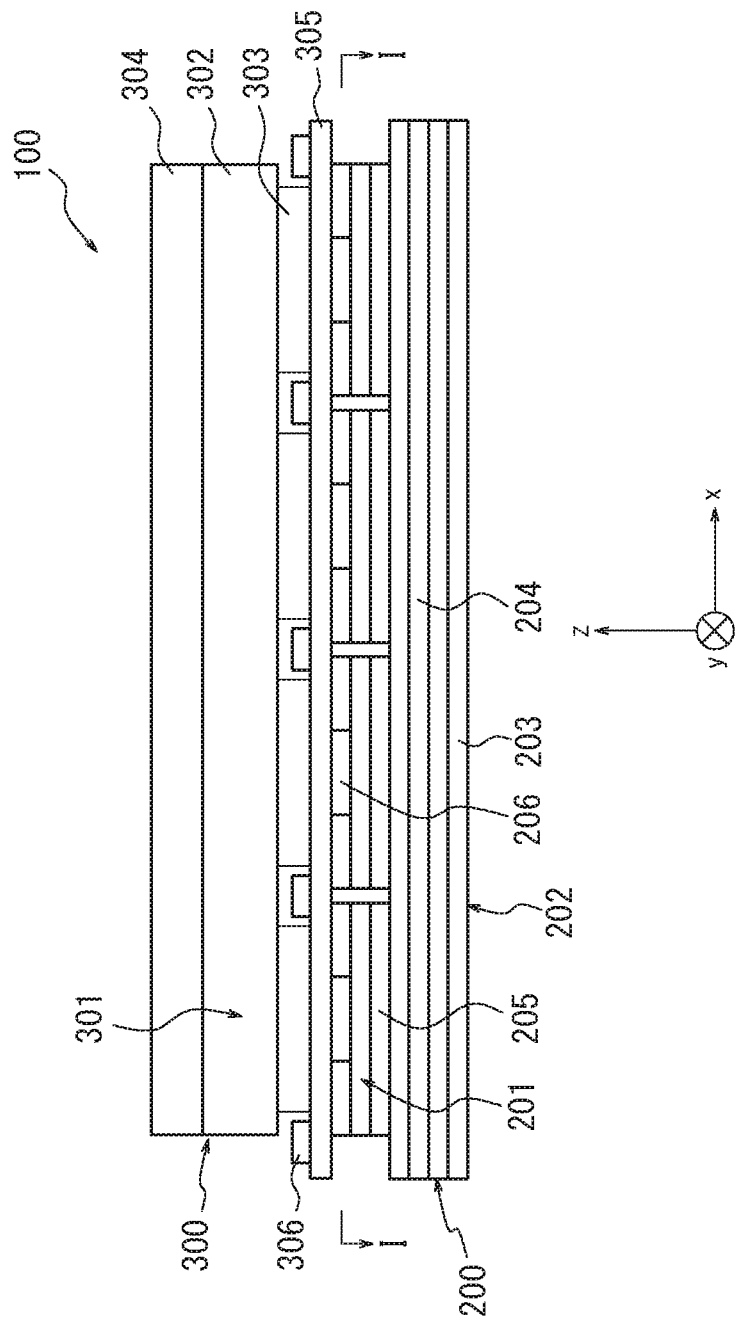
FIG. 2 is a sectional view schematically illustrating a configuration of a main part of the image display device according to Embodiment 1.

FIG. 2 is a sectional view schematically illustrating a configuration of a main part of the disclosed image display device according to Embodiment 1. An image display device 100 of FIG. 2 has a light source part 200 and a phase shift part 300 to act as an observation plane. The light source part 200 includes, for example, a vertical cavity surface emitting laser (VCSEL) array 202 having a plurality of VCSELs 201. The VCSEL array 202 may have a publicly-known configuration disclosed in, for example, JP 2005-45243 A, and has a bottom mirror 203 and an active layer 204 shared in common, and a top mirror 205 for each VCSEL 201. The VCSEL array 202, which is configured as described above with the bottom mirror 203 formed in common, is capable of synchronize the phase of laser light emitted from VCSELs 201 so as to emit the light as coherent light. FIG. 2 is an abridged illustration of the configuration of the VCSEL array 202 for the sake of clarity of the drawing.

Figure 3:
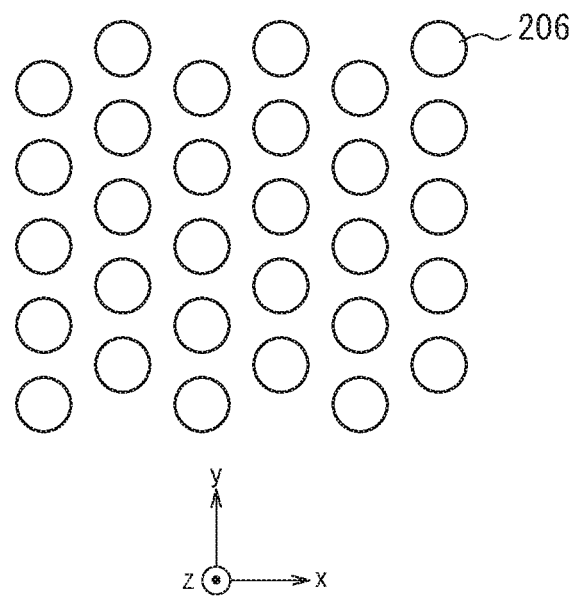
FIG. 3 illustrates an exemplary arrangement of VCSELs in a VCSEL array.
Figure 4:
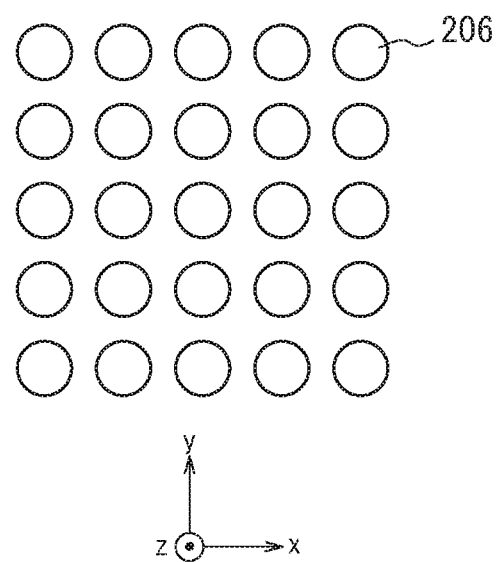
FIG. 4 illustrates another exemplary arrangement of VCSELs in a VCSEL array.

In the VCSEL array 202, the VCSELs 201 have laser emission ports 206 for emitting laser light, which are arranged in the x-y axis plane in two-dimensional directions, for example, as illustrated in FIG. 3 or 4, at a pitch of the wavelength level of the emitted laser light. FIGS. 3 and 4 each are a partial plan view of the VCSEL array 202 as viewed from the line I-I of FIG. 2. In FIG. 3, the laser emission ports 206 are arranged as being staggered at a half pitch of the array pitch in the x-axis direction and the y-axis direction. In FIG. 4, the laser emission ports 206 are arranged in square lattice in the x-axis direction and the y-axis direction. The laser emission ports 206 illustrated in FIGS. 3 and 4 are circular in shape, which, however, may be in an arbitrary shape such as rectangular and hexagonal. In FIGS. 2 to 4, the z-axis direction is perpendicular to the x-axis and y-axis directions, and indicates a direction in which laser light from the VCSELs 201 is emitted. The shape of the laser emission port and the x-, y-, and z-axes are similarly configured in other Embodiments.

Referring to FIG. 2, the phase shift part 300 is arranged on the laser light emission side of the VCSEL array 202 as being optically coupled thereto. The phase shift part 300 has a plurality of phase shift elements 301 associated with the respective VCSELs 201 of the VCSEL array 202. The phase shift elements 301 may be configured by using publicly-known electro-optical elements which vary in refractive index depending on the applied voltage, such as, for example, potassium tantalate niobate (KTN) crystals, lithium niobate (LN) crystals, and liquid crystals. In below, description is given of a KTN crystal 302 as the elctro-optical element.

The phase shift element 301 has a regional electrode part 303 bonded thereto on the incident side of light from the VCSELs 201 and a transparent common electrode 304 disposed on the emission side of light as being commonly bonded to the respective phase shift elements 301. The regional electrode part 303 may be configured by including, for example, a transparent regional electrode and a thin film transistor (TFT) as a switching element connected to the regional electrode. Formed on the regional electrode part 303 side are X-axis wiring line 305 and Y-axis wiring line 306 for selecting the phase shift elements 301.

The X-axis wiring line 305 and the Y-axis wiring line 306 are connected to an X-axis line drive circuit and a Y-axis line drive circuit to be described later, so that the X-axis wiring line 305 is driven by the X-axis line drive circuit and the Y-axis wiring line 306 is driven by the Y-axis line drive circuit. The X-axis line drive circuit and the Y-axis line drive circuit may be configured to drive the phase shift elements 301 by a passive matrix system, but may preferably be configured to drive the elements 301 by an active matrix system.

Figure 5:
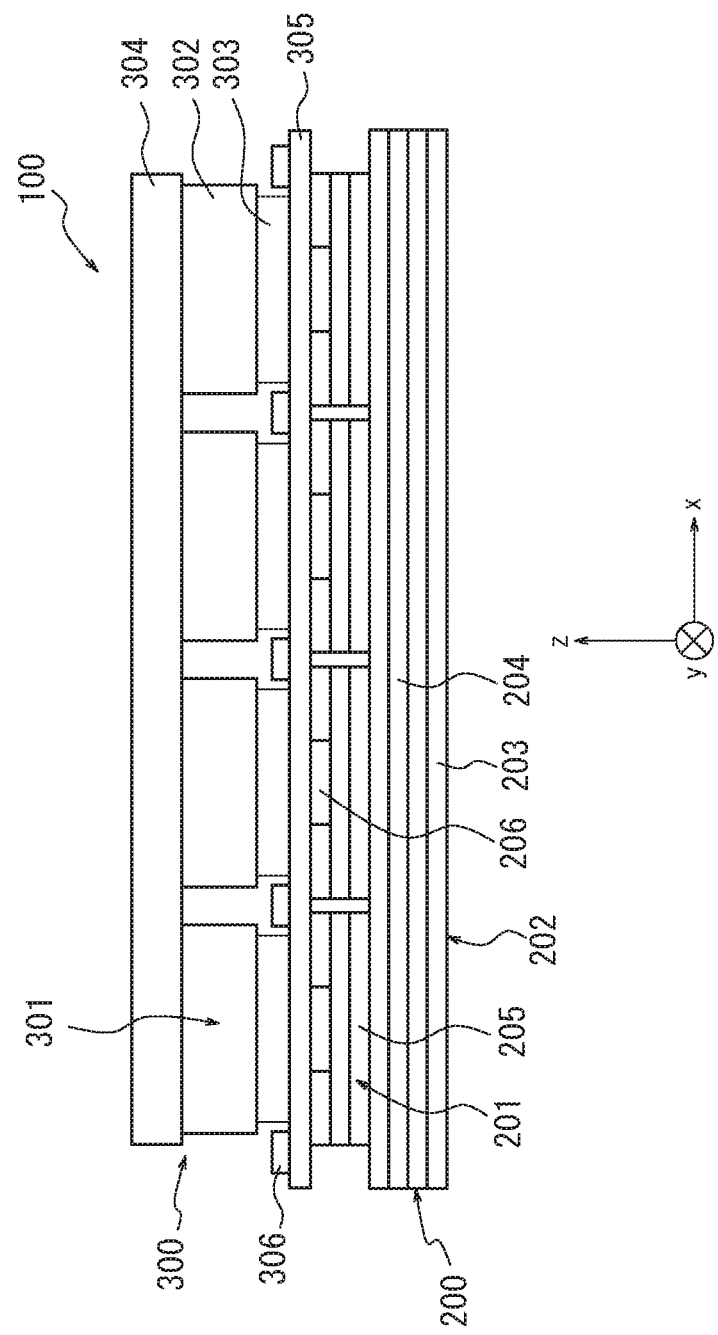
FIG. 5 illustrates another configuration example of the phase shift elements.

Referring to FIG. 2, the phase shift element 301 is configured by forming, on a single plate of the KTN crystal 302, the regional electrode parts 303 associated with the respective VCSELs 201. Without being limited to the configuration of FIG. 2, the phase shift element 301 may be configured, as illustrated in FIG. 5 for example, by forming the regional electrode parts 303 on the KTN crystal 302 divided in units of the Y-axis wiring lines 306. Alternatively, although not shown, the phase shift element 301 may be configured by forming the regional electrode parts 303 on the KTN crystal 302 divided in units of the X-axis electrode wiring lines. The regional electrode part 303 may be formed exclusively of a regional electrode as long as, for example, a switching element may be formed outside the optical path of the phase shift element 301. In such case, the switching element does not necessarily need to be TFT.

Figure 6:
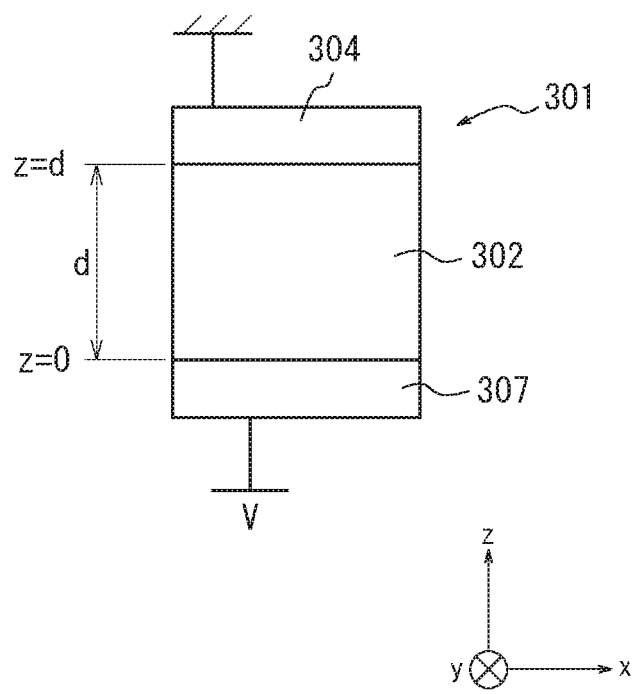
FIG. 6 is for illustrating an operation of KTN crystal.

Here, in the phase shift element 301 having the KTN crystal 302 illustrated in FIG. 6, when a voltage V is applied between the regional electrode 307 and the common electrode 304, the Kerr effect generates a refractive index profile in the application direction (z-axis direction) of the voltage V. The refractive index variation δn(z) in the z-axis direction in this case is represented by Expression (1) below. In Expression (1), $n_0$ represents the refractive index, $\epsilon_0$ represents the permittivity of vacuum, $\epsilon_r$ represents the relative permittivity, d represents the thickness in the z-axis direction of the KTN crystal 302, and z represents the distance from the regional electrode 307 in the z-axis direction.

[Expression 1]

$$\delta n(z) = -0.153 n_0^3 \epsilon_0^2 \epsilon_r^2 \frac{V^2}{d^3} z \qquad (1)$$

When the voltage V is applied to the phase shift element 301, the phase change Δp of light transmitting through between the regional electrode 307 and the common electrode 304 is represented by Expression (2) below. In Expression (2), λ represents the wavelength of the transmitted light.

[Expression 2]

$$\Delta p = \int_0^d \frac{\delta n(z)}{\lambda} \partial z \qquad (2)$$

Figure 7:
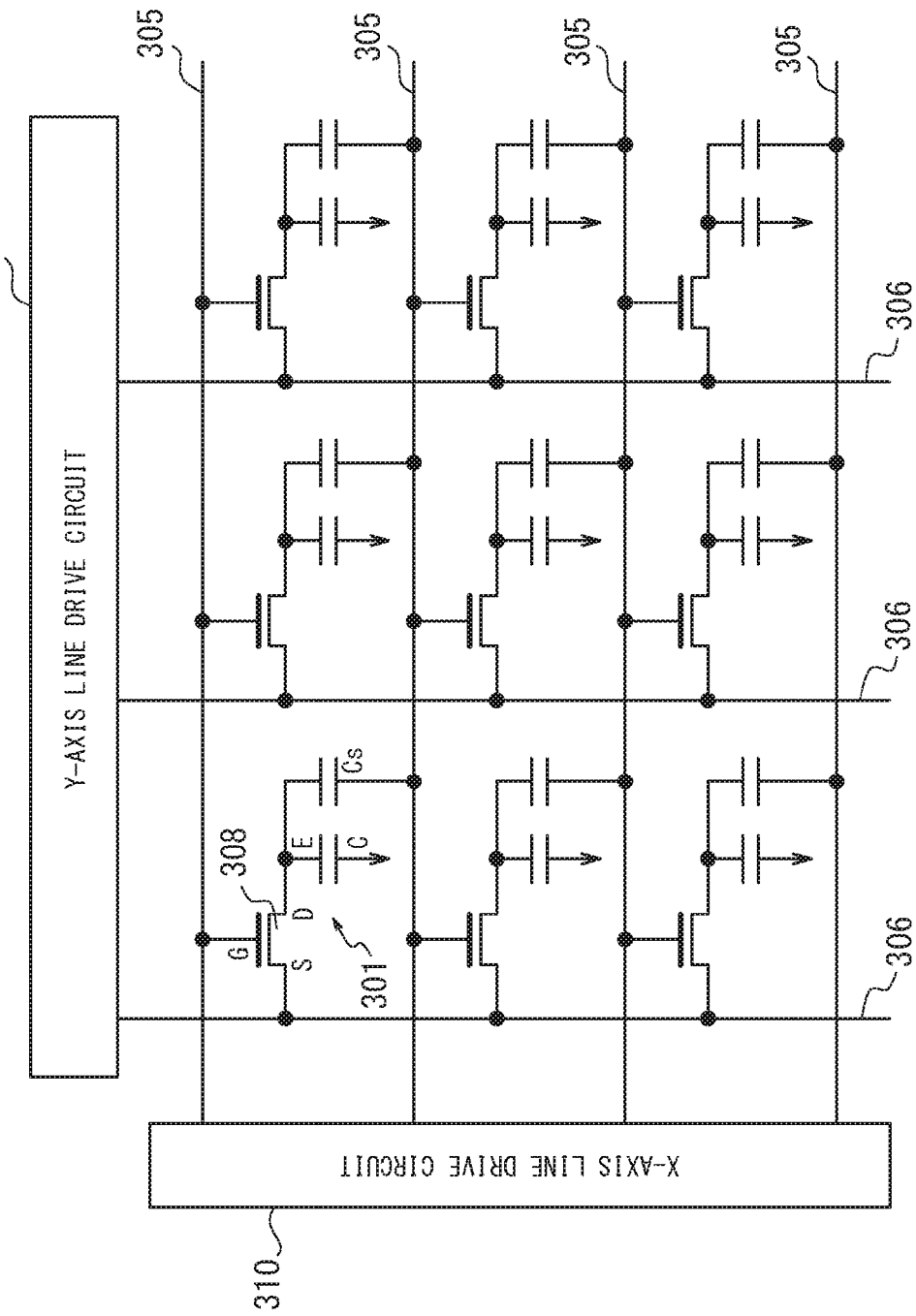
FIG. 7 illustrates a circuit configuration of a phase shift part.

Next, referring to FIGS. 7 to 11, description is given of a case where the phase shift part 300 drives the phase shift elements 301 by an active matrix system. The following description assumes a case where the VCSEL array 202 is arranged in square as illustrated in FIG. 4. Further assumed is a case where the regional electrode part 303 of each of the phase shift elements 301 has the regional electrode 307 and a TFT 308 formed therein. As illustrated in FIG. 7, the X-axis wiring lines 305 are connected to an X-axis line drive circuit 310 and the Y-axis wiring lines 306 are connected to a Y-axis line drive circuit 311.

First, referring to FIG. 7, description is given of a configuration of a drive circuit of the phase shift element 301 associated with each of the VCSELs 201 in the VCSEL array 202. The actual circuit may additionally include electronic components for the purpose of improving the SN ratio and increasing speed; however, FIG. 7 illustrates a circuit equivalent to the drive circuit of the phase shift element 301. The KTN crystal 302, which functions as a dielectric, is represented as a capacitor "C". The regional electrode 307 is denoted by reference symbol "E", while the common electrode 304 on the opposite side is indicated by a downward arrow.

The regional electrode E is connected to a drain D of the TFT 308, while a source S of the TFT 308 is connected to a corresponding one of the Y-axis wiring lines 306, i.e., data lines, so as to be applied with a required voltage by the Y-axis line drive circuit 311. The TFT 308 has a gate G connected to a corresponding one of the X-axis wiring lines 305, i.e., scanning lines. To hold a voltage to be applied to the KTN crystal C, a storage capacitor Cs is formed between the regional electrode E and the X-axis wiring line 305 in the next stage. In FIG. 7, for the clarity of the drawing, components associated with one of the phase shift elements 301 are mainly denoted by the reference symbols.

FIG. 7 illustrates only 3×3 of the phase shift elements 301 (regional electrodes E), which are taken out from the entire array. In practice, the VCSEL array is composed of multiple VCSELs and includes the same number of the regional electrodes E as the VCSELs. The Y-axis line drive circuit 311 applies a voltage according to voltage data, via the Y-axis wiring line 306, to the regional electrode E of the relevant KTN crystal C, while the X-axis line drive circuit 310 applies a control voltage for write-in scanning, via the X-axis wiring line 305, to the gate G of the relevant TFT 308.

Figure 8:
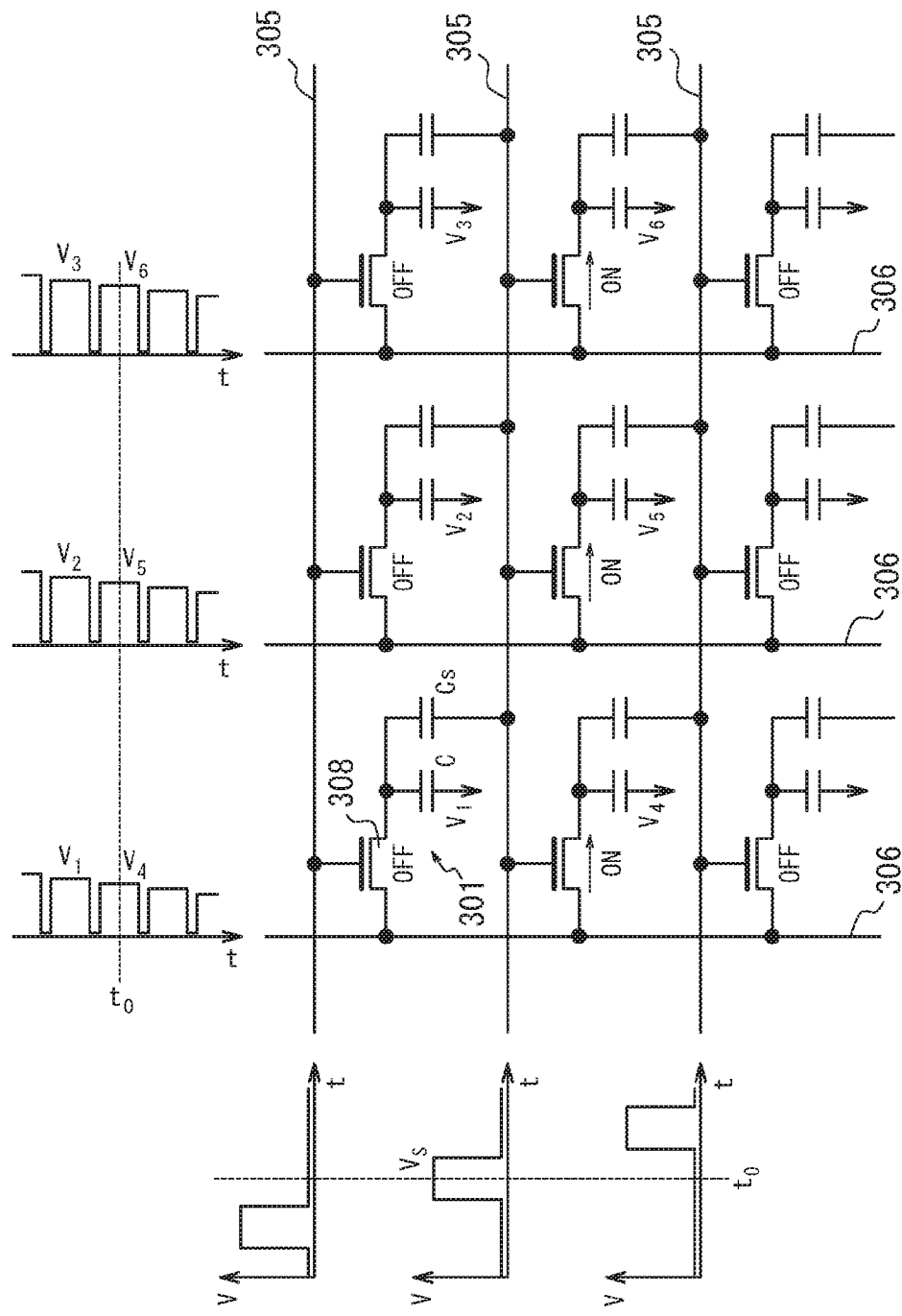
FIG. 8 is for illustrating an operation of the phase shift part.

Next, referring to FIG. 8, description is given of an active matrix drive of the regional electrode E. The X-axis line drive circuit 310 applies a write-in control voltage Vs to the X-axis wiring lines 305 sequentially from the above (scanning). At a current time $t_0$, the X-axis wiring line 305 in the middle is applied with the control voltage Vs. When the control voltage Vs is applied to the gates G of the TFTs 308, all the TFTs 308 connected to this X-axis wiring line 305 are all turned on. Then, electric charges are injected into the regional electrodes E connected to the drains D of the TFTs 308, with the result that the regional electrodes E has the same potential as that of the Y-axis wiring line 306. In this manner, the regional electrode E on each of the VCSELs will be applied with a voltage which is to be applied to the KTN crystal C.

Specifically, the voltage data at the time $t_0$ is $V_4$, $V_5$, $V_6$ sequentially from the Y-axis wiring line 306 on the left, while the regional electrodes E along the X-axis wiring line 305 in the middle where the TFTs 308 are turned on each have potentials of $V_4$, $V_5$, $V_6$, respectively. At a time previous to the time $t_0$, or the time when the control voltage Vs is applied to the X-axis wiring line 305 on the above, the voltages $V_1$, $V_2$, and $V_3$ are applied to the Y-axis wiring line 306, and the voltages $V_1$, $V_2$, and $V_3$ are applied to the relevant regional electrodes E. The voltage applied to the regional electrodes E is held by the storage capacitor Cs.

As described above, the X-axis wiring lines 305 are sequentially scanned from top to bottom, so that data on voltage to be applied to KTN, which is being sent to the Y-axis wiring line 306, is written into the regional electrodes E.

Figure 9:
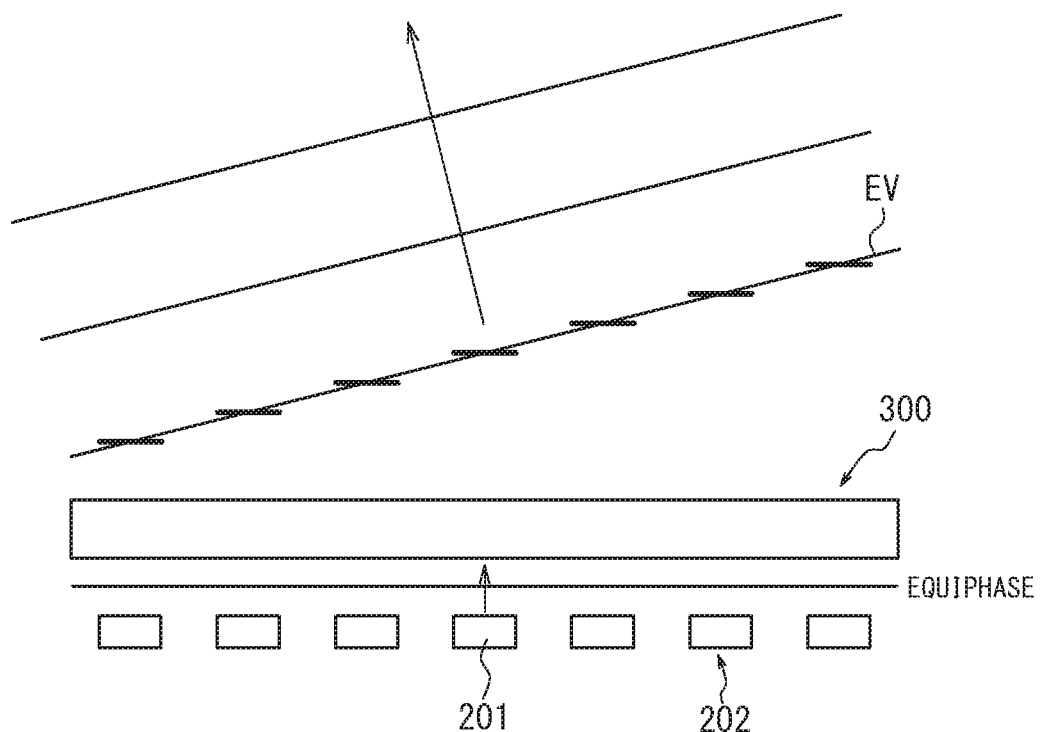
FIG. 9 is for illustrating an example of how an optical beam is shifted by the phase shift part.

Next, referring to FIG. 9, description is given of how the phase shift part 300 deflects a light flux. Light from the VCSELs 201 in the VCSEL array 202 is emitted as plane waves of equiphase, which, however, approximates to spherical waves due to diffraction along with advancement of the wave. Then, these substantially spherical waves are made incident on the phase shift part 300. When a desired voltage is applied to the regional electrode E of each of the phase shift elements of the phase shift part 300, light emitted from the phase shift elements of the phase shift part 300 forms substantially spherical waves which have undergone phase change. The phase shift elements of the phase shift part 300 emit spherical waves having a phase difference form an envelope EV according to Huygens' principle, as the phase shift elements are arranged at a pitch of the wavelength level. Specifically, light emitted from the VCSEL array 202 forms, as a whole, a single plane wave advancing in the direction of the arrow.

Here, a relation of Expression (3) below is established, where $p_i$ represents the arrangement pitch of the phase shift elements, λ represents the wavelength of light emitted from VCSELs 201, Φ represents the phase difference among the phase shift elements, and ω is the emission angle of the plane wave from the phase shift part 300:

$$\sin \omega = \lambda \Phi / \pi p_i \qquad (3)$$

Accordingly, as illustrated in FIG. 9, when phase differences Φ (for example, Φ1 to Φ7) is generated according to Expression (3) above, the light flux from the VCSEL array 202 may be deflected. The size of the phase difference to be given may properly be controlled, so as to continuously change the deflection direction of the light flux, which makes it possible to scan a light flux by a so-called phased array.

Figure 10:
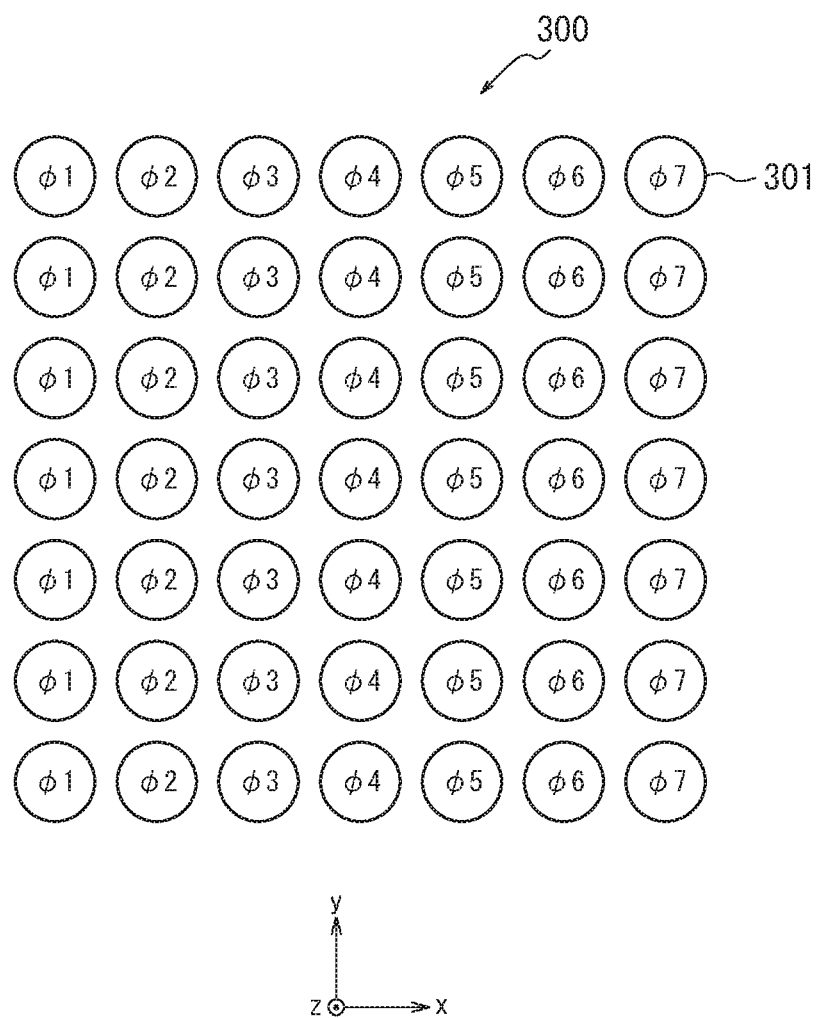
FIG. 10 is a schematic diagram illustrating phase difference control carried out by the phase shift part, which is viewed from the observation plane side.

FIG. 10 is a schematic diagram illustrating phase difference control carried out by the phase shift part 300 of FIG. 9, which is viewed from the observation plane side. As illustrated in FIG. 10, when the phase shift elements 301 in the respective rows in the x-axis direction are given a phase difference that sequentially increases or decreases and the phase shift elements 301 in the respective columns in the y-axis direction are given the same phase difference, a light flux may be deflected in the x-axis direction. On the contrary, when the phase shift elements 301 in the respective rows in the y-axis direction are given a phase difference that sequentially increases or decreases and the phase shift elements 301 in the respective columns in the x-axis direction are given the same phase difference, a light flux may be deflected in the y-axis direction. Data in the x-direction and in the y-direction may be mixed so as to deflect light in the x-direction and the y-direction simultaneously.

Accordingly, light may be continuously deflected through a phased array so as to raster scan the light flux emitted from the VCSEL array 202. The light intensity of the VCSEL array 202 may be modulated in accordance with the raster scan, so as to display an image. Alternatively, a light intensity modulator may be disposed in the optical path from the VCSEL array 202 to the observer, so as to display an image. In this manner, the observer may observe the phase shift part 300, to thereby observe a virtual image of a two-dimensional image.

Figure 11:
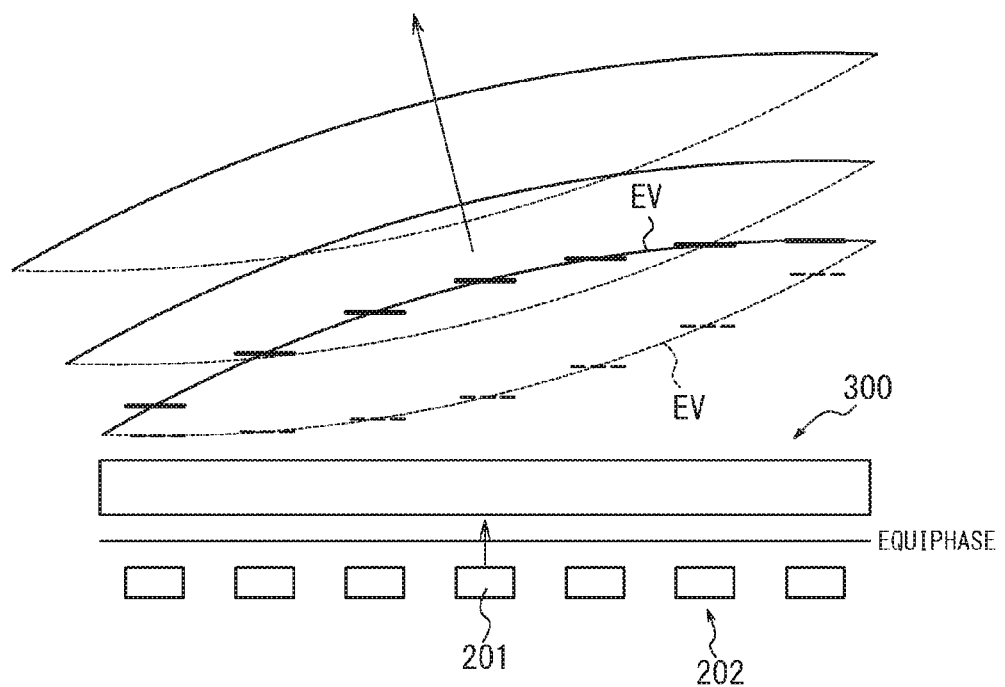
FIG. 11 is for illustrating another example of how an optical beam is shifted by the phase shift part.

As illustrated in FIG. 11, the phase differences Φ1 to Φ7 may be controlled so as to make the envelope EV as a spherical wave. In this case, as indicated by the solid line of FIG. 11, a spherical wave may be emitted in such a manner that the sphere has the center thereof positioned toward the back of the device, that is, positioned forward relative to the VCSEL array 202 when viewed from the observer, so that the observer can clearly see the image even when focusing at a finite distance. Further, as indicted by the broken line of FIG. 11, a spherical wave may be emitted in such a manner that the sphere has the center thereof positioned behind the observer, which allows for even a far-sighted observer to clearly observe an image. In this case, a screen may be installed so as to project an image thereon, allowing the device to be used as a projector.

In the following, description is given of specific Examples. When the VCSELs of the VCSEL array 202 are arranged in square as illustrated in FIG. 4, at a pitch of 1.5 µm between the VCSELs, with the size of the observation plane, i.e., the size of an opening (pupil) being 100 mm×50 mm, the number of VCSELs is obtained as 66,667×33,333. Therefore, in the case of driving the elements through the active matrix system of FIG. 7, the number of the X-axis wiring lines 305 becomes 33,333, which means that Vs signal may be output sequentially from the above for 33,333 times in order to rewrite all the regional electrodes at once. Here, as illustrated in FIG. 10, in order to control the deflection direction of light in all the phase shift elements of the phase shift part 300 so as to display a screen of SVGA (pixel number 800×600) at a frame rate of 30 fps, the rewriting rate may be set to 480,000×30 Hz=14.4 MHz, and the transmission timing of voltage data to the Y-axis wiring lines 306 may be set to 14.4 MHz×33,333=479 GHz. In this case, the width of the Vs signal, that is, the switching speed of the TFT 308 becomes 2 ps.

The deflection of light flux may not be limitedly controlled by all the phase shift elements of the phase shift part 300, and may be controlled by dividing the phase shift part 300. The sub-divided regions in this case each may preferably be of, for example, on the order of 0.5 mm×0.5 mm to several mm×several mm so as not to be affected by the spread due to diffraction. In this case, the VCSELs of different regions do not need to be synchronized in phase, and the light fluxes between the sub-divided regions are incoherent to one another. In the case where the region is of 0.5 mm×0.5 mm, the number of VCSELs is obtained as 333×333. Further, the transmission timing of voltage data to the Y-axis wiring line 306 is obtained as 14.4 MHz×333=4.8 GHz, and the width of the Vs signal, that is, the switching speed of the TFT 308 becomes 0.2 ns. Accordingly, as compared to the former case of controlling the deflection by all the phase shift elements, the X-axis line drive circuit 310 and the Y-axis line drive circuit 311 may be configured with ease.

Embodiment 1 enables the following configurations.
<In the VCSEL Array 202 Arranged as Illustrated in FIG. 3>
Pitch between the phase shift elements=pitch between VCSELs=
2.4 µm in the x-axis direction,
1.2 µm in the y-axis direction
Thickness d of KTN crystal: 1 µm
Voltage applied to KTN crystal: 0 to 4.18 V (phase difference 0 to λ)
Wavelength (λ) of light emitted from VCSEL array: 640 nm
Scanning maximum angle (half angle):
18.75° in the x-axis direction,
15.5° in the y-axis direction
Observation plane area: 100 mm×50 mm
Frame rate: 30 fps
Number of X-axis wiring lines=the number of scanning lines: 600 to 1080.
<In the VCSEL Array 202 Arranged as Illustrated in FIG. 4>
Pitch between the phase shift elements =pitch between VCSELs =
1.5 µm in the x-axis direction,
1.5 µm in the y-axis direction
Thickness d of KTN crystal: 1 µm
Voltage applied to KTN crystal: 0 to 4.18 V (phase difference 0 to λ)
Wavelength (λ) of light emitted from VCSEL array: 640 nm
Scanning maximum angle (half angle):
25° in the x-axis direction,
25° in the y-axis direction
Observation plane area: 100 mm×50 mm
Frame rate: 30 fps
Number of X-axis wiring lines=the number of scanning lines: 600 to 1080.

Embodiment 2

Figure 12:
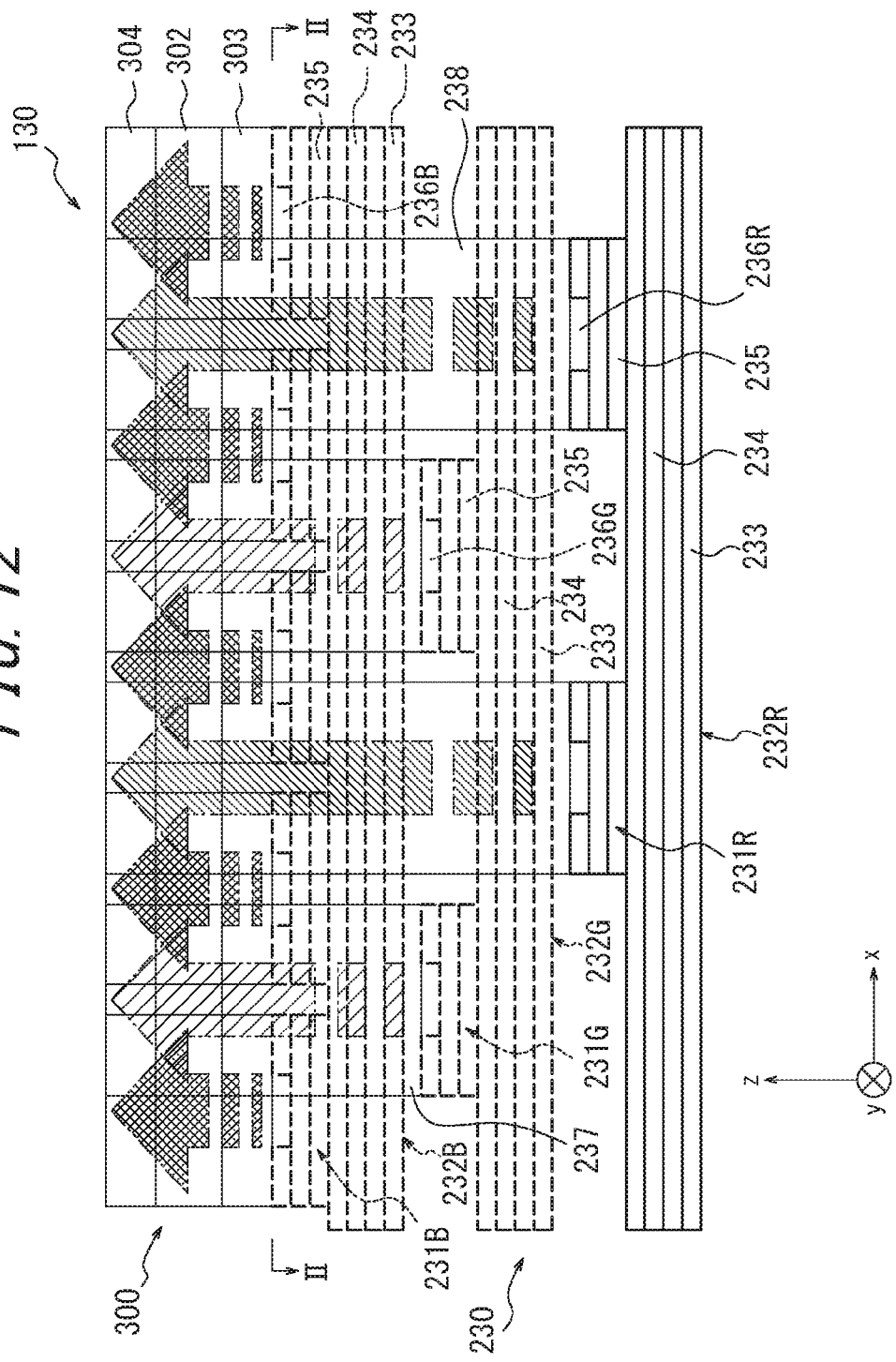
FIG. 12 is a sectional view schematically illustrating a configuration of a main part of the image display device according to Embodiment 2.

FIG. 12 is a sectional view schematically illustrating a configuration of a main part of the image display device according to Embodiment 2. The image display device 130 of FIG. 12 is for displaying a color image, and different in configuration of the light source part from the image display device 100 of Embodiment 1. The components similar to those of Embodiment 1 are denoted by the same reference symbols to omit the description thereof.

In Embodiment 2, the light source part 230 includes, for example: a VCSEL array 232R having a plurality of VCSELs 231R for emitting red laser light (R); a VCSEL array 232G having a plurality of VCSELs 231G for emitting green laser light (G); and a VCSEL array 232B having a plurality of VCSELs 231B for emitting blue laser light (B). The VCSEL arrays 232R, 232G, and 232B are each configured by including, similarly to the VCSEL array 202 explained in Embodiment 1, a bottom mirror 233 and an active layer 234 each being shared in common, the active layer 234 being associated with the wavelength of the laser light to be emitted, and a top mirror 235 for each VCSEL. FIG. 12 is an abridged illustration of the configuration of each of the VCSEL arrays 232R, 232G, and 232B for the clarity of the drawing. Further, the illustration of the X-axis wiring lines and the Y-axis wiring lines in the phase shift part 300 is omitted.

Figure 13:
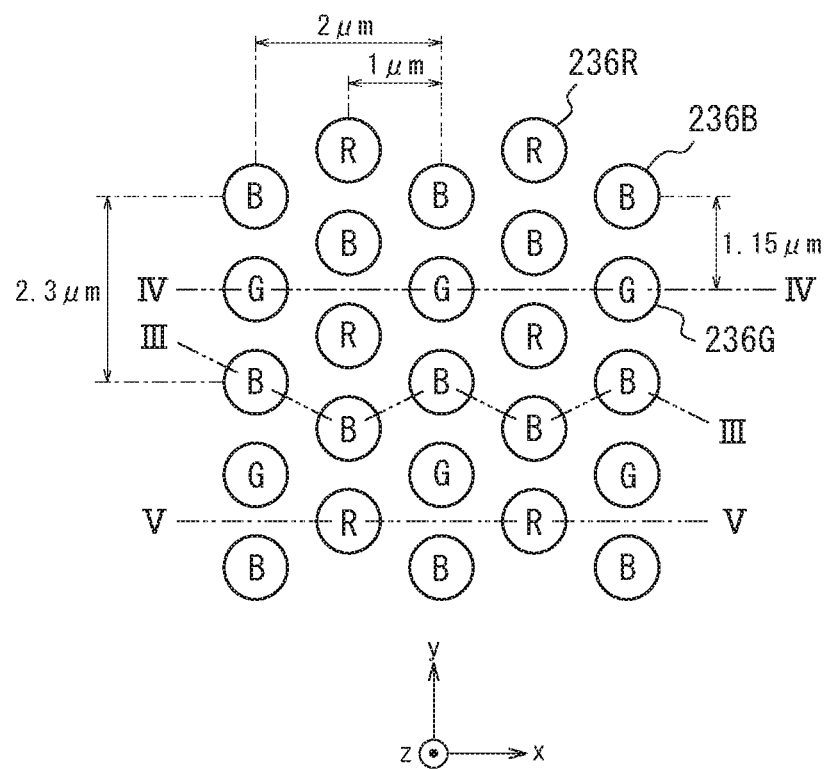
FIG. 13 illustrates an example of an arrangement of VCSELs in a VCSEL array.

In the VCSEL arrays 232R, 232G, and 232B, the VCSELs 231R, 231G, and 231B each have laser emission ports 236R, 236G, and 236B, respectively, which are arranged in two-dimensional directions on an x-y axis plane at a pitch of the wavelength level, as illustrated in, for example, FIG. 13. FIG. 13 is a part of a plan view of the VCSEL arrays 232R, 232G, and 232B viewed from the line II-II of FIG. 12. Specifically, rows in the x-axis direction each have a pattern in which R row, B row, B row, and G row are repeated in the stated order, and rows in the y-axis direction each have a pattern in which a column of alternately-arranged B and G and a column of alternately-arranged R and B are repeated. The pitch of the laser emission ports of the same color and the pitch of the laser emission ports adjacent to each other may be defined, for example, as illustrated in FIG. 13. That is, the laser emission ports of the same color may be arranged at a pitch of 2 µm in the x-axis direction and at a pitch of 2.3 µm in the y-axis direction, and the laser emission ports adjacent to each other may be arranged at a pitch of 1 µm in the x-axis direction and at a pitch of 1.15 µm in the y-axis direction.

Figure 14:
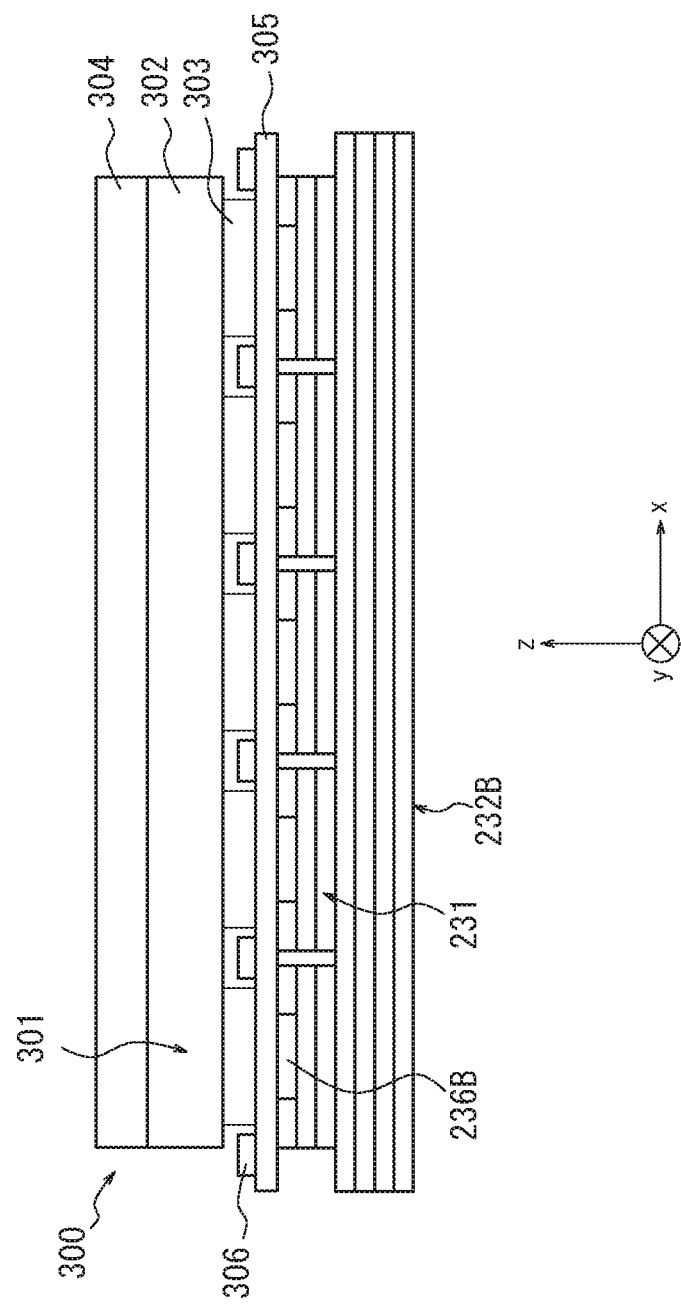
FIG. 14 is a schematic illustration of a section taken along the line III-III of FIG. 13.
Figure 15:
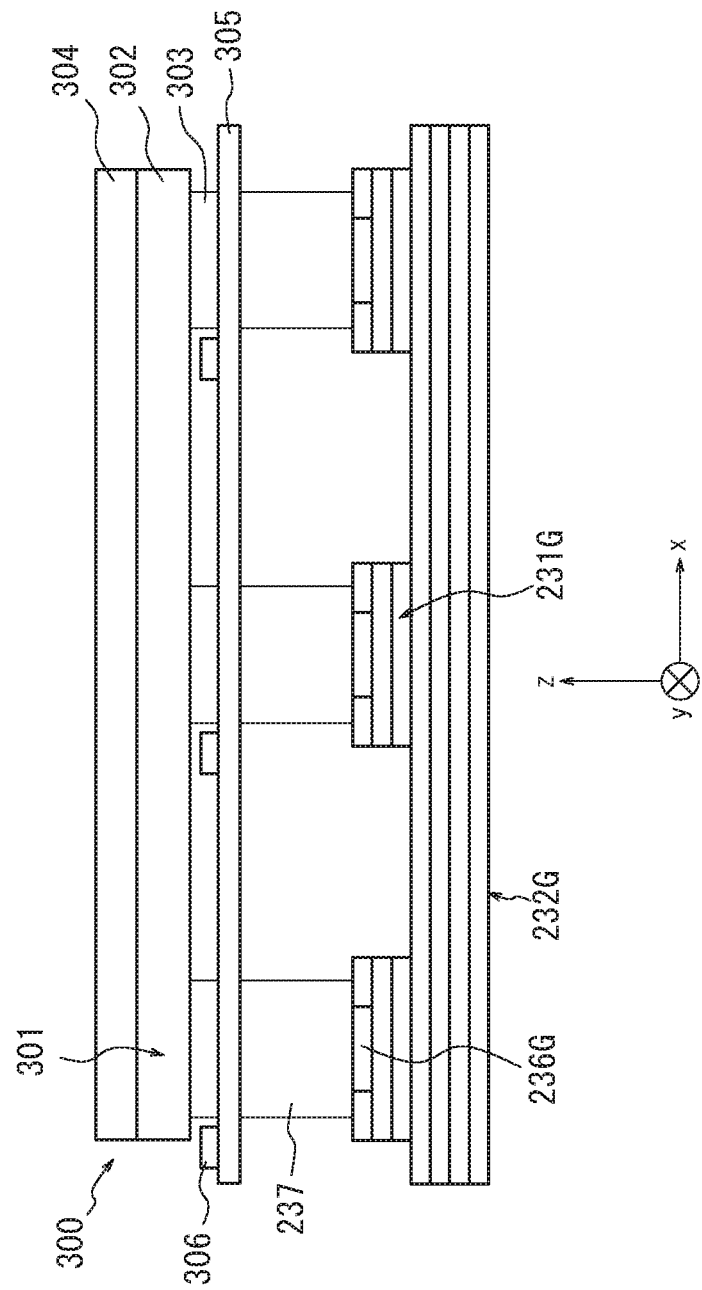
FIG. 15 is a schematic illustration of a section taken along the line IV-IV of FIG. 13.
Figure 16:
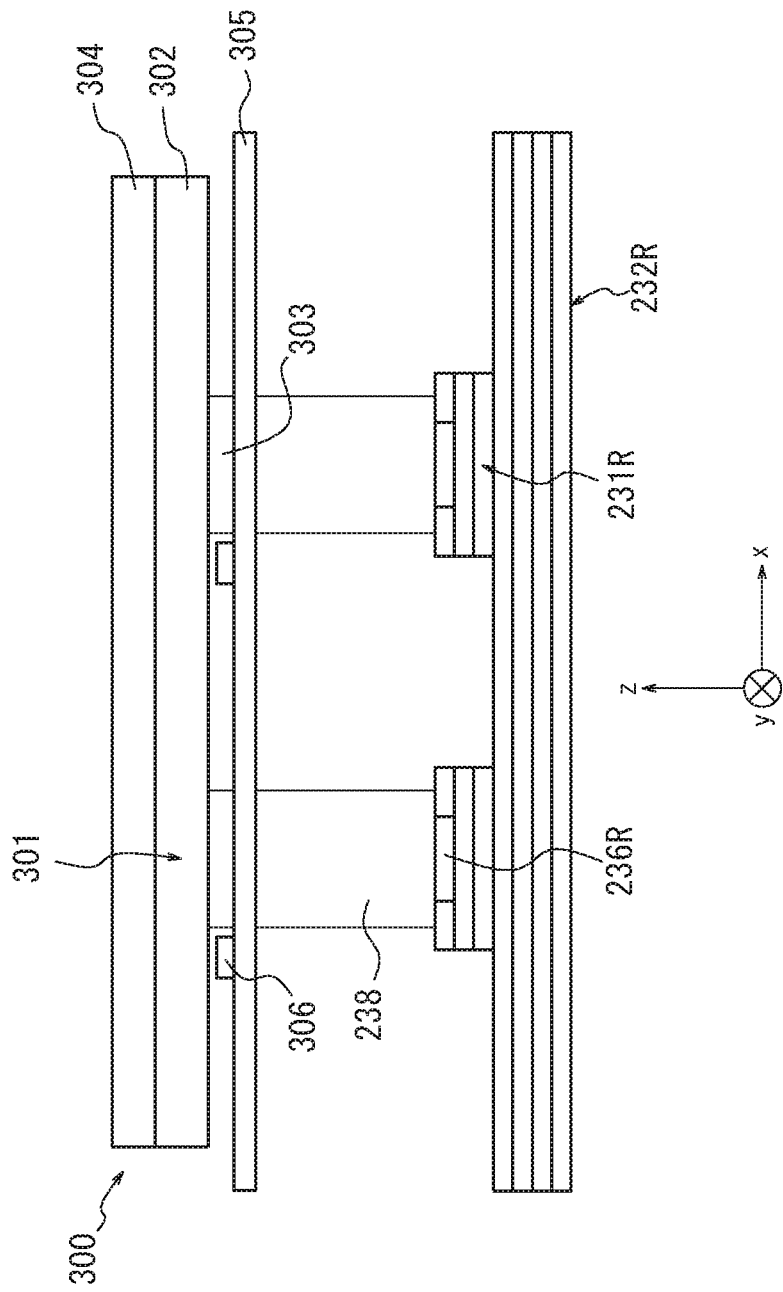
FIG. 16 is a schematic illustration of a section taken along the line V-V of FIG. 13.

As shown in FIG. 14 schematically illustrating a section taken along the line of FIG. 13, the VCSEL array 232B is optically coupled, on the laser emission port 236B side, to the phase shift part 300 configured similarly to that of Embodiment 1. As shown in FIG. 15 schematically illustrating a section taken along the line IV-IV of FIG. 13, the VCSEL array 232G is optically coupled, on the laser emission port 236G side, to the phase shift part 300 via a waveguide 237. Similarly, as shown in FIG. 16 schematically illustrating a section taken along the line V-V of FIG. 13, the VCSEL array 232R is optically coupled, on the laser emission port 236R side, to the phase shift part 300 via a waveguide 238. The phase shift part 300 has a plurality of phase shift elements 301 associated with the VCSELs 231R, 231G, and 231R of the VCSEL arrays 232R, 232G, and 232B.

As is apparent from FIG. 13, the image display device 130 of Embodiment 2 has an increased number of VCSELs 231B for emitting blue laser light so as to reduce the pitch of the VCSELs 231B adjacent to each other, for the following reason. The emission angle ω becomes smaller when the wavelength λ is shorter, as can be understood from Expression (3), and thus, the VCSELs 231B emitting blue laser light of short wavelength λ are increased in number so as to be arranged at a smaller pitch, to thereby obtain a desired emission angle ω. It may of course be possible to change the pitches in the x-axis direction and the y-axis direction to be different from each other depending to the field angle in the x-axis direction and the y-axis direction.

The VCSEL arrays 232R, 232G, and 232B of respective colors are turned on sequentially for each color or all at once, depending on the color information on the pixel to be displayed. The phase shift part 300 scans, similarly as explained in Embodiment 1, the emitted light in two-dimensional directions by a phased array, depending on the position of the pixel to be displayed. With this configuration, the observer may view the phase shift part 300, to thereby observe a color image.

Embodiment 2 enables the following configuration.
Wavelengths: R; 640 nm, G; 530 nm, B; 450 nm
Pitch between the phase shift elements=pitch between VCSELs=as shown in FIG. 13,
Thickness d of KTN crystal: 1 µm
Voltage applied to KTN crystal: 0 to 4.18 V (phase difference 0 to λ)
Scanning maximum angle (half angle):
15.4° in the x-axis direction,
11.3° in the y-axis direction
Observation plane area: 200 mm×100 mm
Frame rate: 30 fps
Number of X-axis wiring lines=the number of scanning lines: 600 to 1080

Embodiment 3

Figure 17:
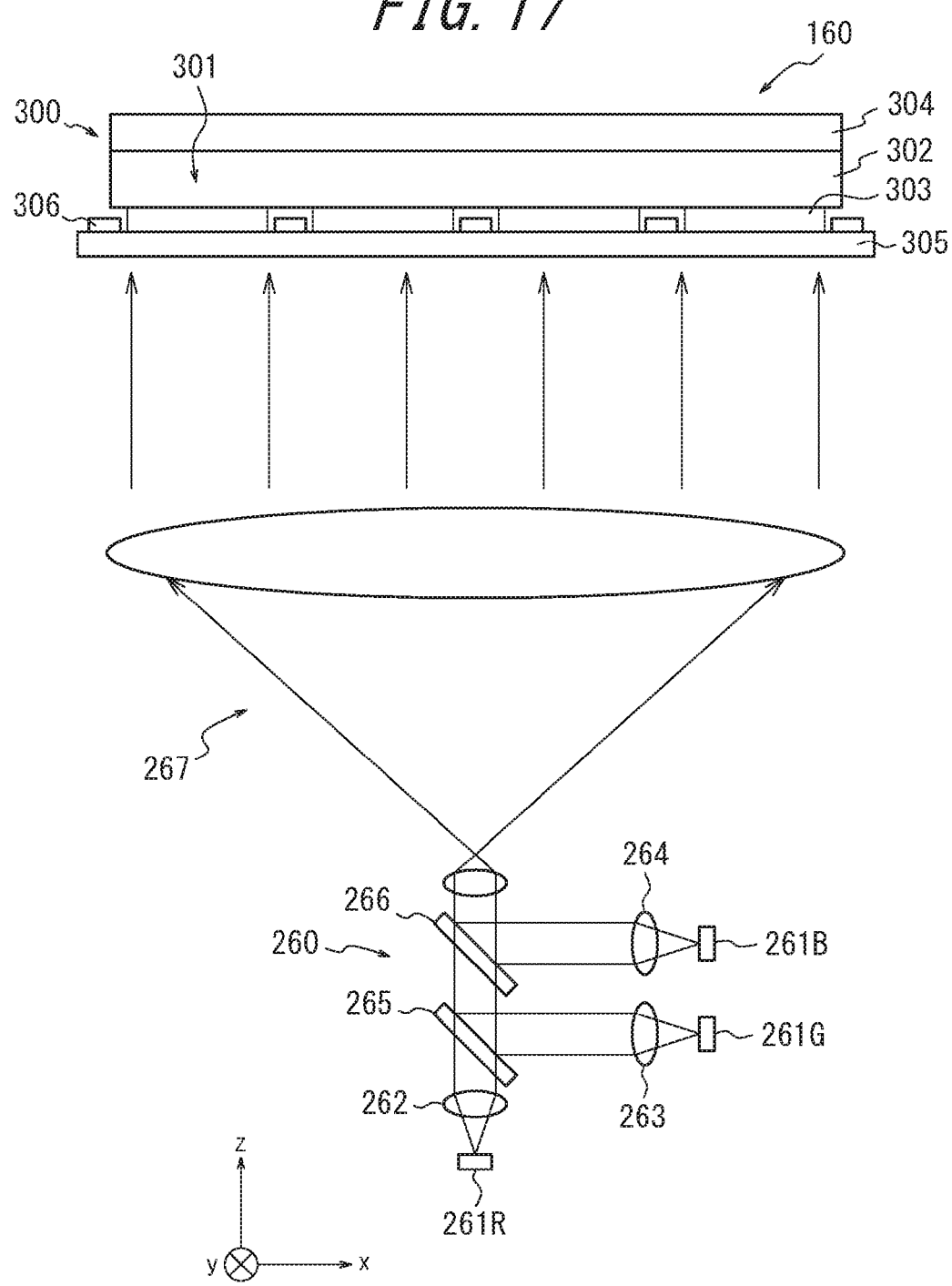
FIG. 17 is a sectional view schematically illustrating a configuration of a main part of the image display device according to Embodiment 3.

FIG. 17 is a sectional view schematically illustrating a configuration of a main part of the image display device according to Embodiment 3. The image display device 160 of FIG. 17 is for displaying a color image, and different in configuration of the light source part from the image display device 100 of Embodiment 1. The components similar to those of Embodiment 1 are denoted by the same reference symbols to omit the description thereof.

In Embodiment 3, the light source part 260 includes, for example: a laser diode 261R for emitting red laser light (R); a laser diode 261G for emitting green laser light (G); a laser diode 261B for emitting blue laser light (B); three collimator lenses 262, 263, 264; two dichroic mirrors 265, 266; and a beam expander 267. The red laser light emitted from the laser diode 261R is converted into parallel light through the collimator lens 262 and sequentially passes through the dichroic mirrors 265 and 266, before the light flux thereof is expanded by the beam expander 267 and caused to incident, as parallel light, onto the phase shift part 300. The green laser light emitted from the laser diode 261G is converted into parallel light through the collimator lens 263 and reflected by the dichroic mirror 265 to be synthesized coaxially with the optical path of the red laser light and then pass through the dichroic mirror 266, before the light flux thereof is expanded by the beam expander 267 and caused to incident, as parallel light, onto the phase shift part 300. The blue laser light emitted from the laser diode 261B is converted into parallel light by the collimator lens 264, reflected by the dichroic mirror 266 to be synthesized coaxially with the optical paths of the red laser light and the green laser light, before the light flux thereof is expanded by the beam expander 267 and caused to incident, as parallel light, onto the phase shift part 300.

The laser diodes 261R, 261G, and 261B of respective colors are turned on sequentially or all at once, depending on the color information on the pixel to be displayed. The phase shift part 300 is configured by having a plurality of phase shift elements 301 arranged in two-dimensional directions at a pitch of the wavelength level, and as in Embodiment 1, scans the emitted light in two-dimensional directions by a phased array, depending on the position of the pixel to be displayed. With this configuration, the observer may view the phase shift part 300, to thereby observe a color image.

The present disclosure is not limited to Embodiments above, and may be subjected to various modifications and alterations without departing from the gist of the disclosure. For example, in displaying a color image, the light sources are not limited to the three colors of RGB, and may further be configured, for example, to emit light of wavelengths of four or more colors with the addition of a yellow light source. Further, in Embodiments above, the refractive index variation resulting from electro-optical crystal has been used as the phase shift; however, a refractive index variation caused by carrier plasma effect may also be used.

REFERENCE SIGNS LIST 100, 130, 160 image display device
200, 230, 260 light source part
201, 231R, 231G, 231B surface emitting laser (VCSEL)
202, 232R, 232G, 232B VCSEL array
206, 236R, 236G, 236B laser emission port
261R, 261G, 261B laser diode
265, 266 dichroic mirror
267 beam expander
300 phase shift part
301 phase shift element
302 KTN crystal
303 regional electrode part
304 common electrode
305 X-axis wiring line
306 Y-axis wiring line
308 TFT
310 X-axis line drive circuit
311 Y-axis line drive circuit

The invention claimed is:

1. An image display device, comprising:

a light source part for emitting coherent light; and a phase shift part having a plurality of phase shift elements arranged in two-dimensional directions and scanning the wavefront of the coherent light from the light source part in two-dimensional directions, wherein the light source part has a plurality of vertical cavity surface emitting lasers each being associated with the respective one of the plurality of the phase shift elements; and wherein the plurality of vertical cavity surface emitting lasers are composed of a plurality of vertical cavity surface emitting lasers for emitting light of different wavelengths, where a plurality of the vertical cavity surface emitting lasers emitting light having a short wavelength are arranged at a smaller pitch as compared with a plurality of the vertical cavity surface emitting lasers emitting light having a long wavelength.

2. The image display device according to claim 1, wherein the phase shift element has an electro-optical element whose refractive index varies due to a voltage applied thereto.

3. The image display device according to claim 2, wherein the electro-optical element is formed of KTN crystal.

4. The image display device according to claim 2, wherein the electro-optical element is formed of liquid crystal.

5. The image display device according to claim 2, wherein the phase shift part drives the plurality of the phase shift elements by an active matrix system.

6. The image display device according to claim 1, wherein the phase shift part scans the wavefront of coherent light from the light source part, as a plane wave or a spherical wave.

* * * * *